(12) United States Patent
Mohapatra et al.

(10) Patent No.: US 10,388,764 B2
(45) Date of Patent: Aug. 20, 2019

(54) HIGH-ELECTRON-MOBILITY TRANSISTORS WITH COUNTER-DOPED DOPANT DIFFUSION BARRIER

(71) Applicant: Intel Corporation, Santa Clara, CA (US)

(72) Inventors: Chandra S. Mohapatra, Beaverton, OR (US); Harold W. Kennel, Portland, OR (US); Matthew V. Metz, Portland, OR (US); Gilbert Dewey, Hillsboro, OR (US); Willy Rachmady, Beaverton, OR (US); Anand S. Murthy, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,448

(22) PCT Filed: Sep. 25, 2015

(86) PCT No.: PCT/US2015/052299
§ 371 (c)(1),
(2) Date: Feb. 26, 2018

(87) PCT Pub. No.: WO2017/052608
PCT Pub. Date: Mar. 30, 2017

(65) Prior Publication Data
US 2018/0254332 A1 Sep. 6, 2018

(51) Int. Cl.
*H01L 29/66* (2006.01)
*H01L 21/02* (2006.01)
(Continued)

(52) U.S. Cl.
CPC .... *H01L 29/66795* (2013.01); *H01L 21/0243* (2013.01); *H01L 21/02381* (2013.01);
(Continued)

(58) Field of Classification Search
CPC ............ H01L 29/66462; H01L 29/778; H01L 29/785; H01L 27/0924
See application file for complete search history.

(56) References Cited

U.S. PATENT DOCUMENTS 4,566,025 A 1/1986 Jastrzebsk et al.
8,264,032 B2 9/2012 Yeh
(Continued)

OTHER PUBLICATIONS

International search Report and Written Opinion for International Patent Application No. PCT/US2015/052299, dated Jun. 15, 2016.
(Continued)

*Primary Examiner* — Mark V Prenty
(74) *Attorney, Agent, or Firm* — Green, Howard, & Mughal LLP

(57) ABSTRACT

III-V compound semiconductor devices, such transistors, may be formed in active regions of a III-V semiconductor material disposed over a silicon substrate. A counter-doped portion of a III-V semiconductor material provides a diffusion barrier retarding diffusion of silicon from the substrate into III-V semiconductor material where it might otherwise behave as electrically active amphoteric contaminate in the III-V material. In some embodiments, counter-dopants (e.g., acceptor impurities) are introduced in-situ during epitaxial growth of a base portion of a sub-fin structure. With the counter-doped region limited to a base of the sub-fin structure, risk of the counter-dopant atoms thermally diffusing into an active region of a III-V transistor is mitigated.

15 Claims, 8 Drawing Sheets

(51) Int. Cl.
*H01L 27/092* (2006.01)
*H01L 29/778* (2006.01)
*H01L 29/78* (2006.01)

(52) U.S. Cl.
CPC .. *H01L 21/02455* (2013.01); *H01L 21/02494* (2013.01); *H01L 21/02538* (2013.01); *H01L 21/02639* (2013.01); *H01L 27/0924* (2013.01); *H01L 29/66462* (2013.01); *H01L 29/778* (2013.01); *H01L 29/7851* (2013.01)

(56) References Cited

U.S. PATENT DOCUMENTS

| | | | |
|---|---|---|---|
| 8,674,341 | B2 | 3/2014 | Ko |
| 9,653,580 | B2 | 5/2017 | Balakrishnan et al. |
| 2002/0185679 | A1 | 12/2002 | Baliga et al. |
| 2004/0211955 | A1 | 10/2004 | Hsu et al. |
| 2005/0093033 | A1 | 5/2005 | Kinoshita et al. |
| 2007/0090416 | A1 | 4/2007 | Doyle et al. |
| 2009/0108350 | A1 | 4/2009 | Cai et al. |
| 2010/0025771 | A1 | 2/2010 | Hoentschel et al. |
| 2010/0148153 | A1 | 6/2010 | Hudait et al. |
| 2010/0163847 | A1 | 7/2010 | Majhi |
| 2010/0193840 | A1 | 8/2010 | Doyle |
| 2010/0252862 | A1 | 10/2010 | Ko |
| 2011/0133292 | A1 | 6/2011 | Lee et al. |
| 2012/0007183 | A1 | 1/2012 | Chang et al. |
| 2012/0139047 | A1 | 6/2012 | Luo |
| 2012/0248502 | A1 | 10/2012 | Cheng |
| 2013/0056795 | A1 | 3/2013 | Wu et al. |
| 2013/0113051 | A1 | 5/2013 | Cai et al. |
| 2013/0134488 | A1 | 5/2013 | Fumitake |
| 2013/0228875 | A1 | 9/2013 | Lee et al. |
| 2014/0070276 | A1 | 3/2014 | Ko et al. |
| 2014/0084239 | A1 | 3/2014 | Radosavljevic et al. |
| 2014/0175515 | A1 | 6/2014 | Then |
| 2014/0252478 | A1 | 9/2014 | Doornbos et al. |
| 2014/0374841 | A1 | 12/2014 | Wang et al. |
| 2015/0021662 | A1 | 1/2015 | Basu et al. |
| 2015/0093868 | A1 | 4/2015 | Obradovic et al. |
| 2015/0228795 | A1 | 8/2015 | Yang et al. |
| 2015/0236114 | A1 | 8/2015 | Ching et al. |
| 2015/0243756 | A1 | 8/2015 | Obradovic et al. |
| 2015/0255456 | A1* | 9/2015 | Jacob .................. H01L 27/0886 |
| | | | 257/401 |
| 2015/0255460 | A1 | 9/2015 | Cheng et al. |
| 2015/0255545 | A1 | 9/2015 | Holland et al. |
| 2015/0255548 | A1 | 9/2015 | Holland et al. |
| 2015/0263138 | A1 | 9/2015 | Kim |
| 2015/0263159 | A1 | 9/2015 | Ching et al. |
| 2016/0005834 | A1 | 1/2016 | Pawlak et al. |
| 2016/0043188 | A1 | 2/2016 | Chu et al. |
| 2016/0204263 | A1 | 7/2016 | Mukherjee et al. |
| 2017/0047404 | A1 | 2/2017 | Bentley et al. |
| 2018/0145077 | A1 | 5/2018 | Dewey et al. |
| 2018/0254332 | A1* | 9/2018 | Mohapatra ........ H01L 29/66795 |

OTHER PUBLICATIONS

International Search Report and Written Opinion for International Patent Application No. PCT/US2015/052345, dated Jun. 20, 2016.
International Search Report and Written Opinion, dated Jun. 15, 2016 for PCT Patent No. PCT/US15/52302.
International Search Report and Written Opinion from PCT/US2015/052342 dated Jun. 15, 2016, 9 pgs.
International Preliminary Report on Patentability for International Patent Application No. PCT/US15/52299, dated Apr. 5, 2018
Ayers, J.E. , "Epitaxy", <http://engr.uconn.edu/~jayers/epitaxy.htm>, online Jun. 15, 2015, 16 pgs.
Huang, C-Y "III-V Ultra-Thin-Body InGaAs/InAs MOSFETs for Low Standby Power Logic Applications", University of California Santa Barbara, Doctoral Thesis, Sep. 2015, pp. 1-167.
Nahory, R.E. "Band gap versus composition and demonstration of Vegard's law for In1-xGaxAsyP1-y lattice matched to LnP", App. Phys. Lett. 33(7), pp. 659-661, Oct. 1978.
Nahory, R.E. "Energy-Gap Values for InxGA1-xAs at 300k", The Semiconductors-Information Web-Site, Sep. 2018 <hhtps://www.semiconductors.co.uk/eg(ingaas).html>, 4 pgs.
Porod, W. "Modification of the virtual-crystal approximation for ternary III-V compounds", Phys. Rev., B27, No. 4, pp. 2587-2589, Feb. 15, 1983.

* cited by examiner

HIGH-ELECTRON-MOBILITY TRANSISTORS WITH COUNTER-DOPED DOPANT DIFFUSION BARRIER

CLAIM OF PRIORITY

This Application is a National Stage Entry of, and claims priority to, PCT Application No. PCT/US15/52299, filed on 25 Sep. 2015 and titled "HIGH-ELECTRON-MOBILITY TRANSISTORS WITH COUNTER-DOPED DOPANT DIFFUSION BARRIER", which is incorporated by reference in its entirety for all purposes.

BACKGROUND

Demand for integrated circuits (ICs) in portable electronic applications has motivated greater levels of semiconductor device integration. Many advanced semiconductor devices in development leverage non-silicon semiconductor materials, including compound semiconductor materials (e.g., GaAs, InP, InGaAs, InAs, and III-N materials). These non-silicon material systems may be employed in high electron mobility transistors (HEMT), some of which may be metal oxide semiconductor field effect transistors (MOSFET).

One technique for fabricating high electron mobility transistors includes forming a non-silicon crystalline device region (e.g., a transistor channel region) over a crystalline silicon substrate. One problem however is that silicon atoms from the underlying substrate can act as a contaminant within non-silicon device regions. Techniques and structures to mitigate the problem of silicon contamination are therefore advantageous in the fabrication of HEMTs on silicon substrates.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
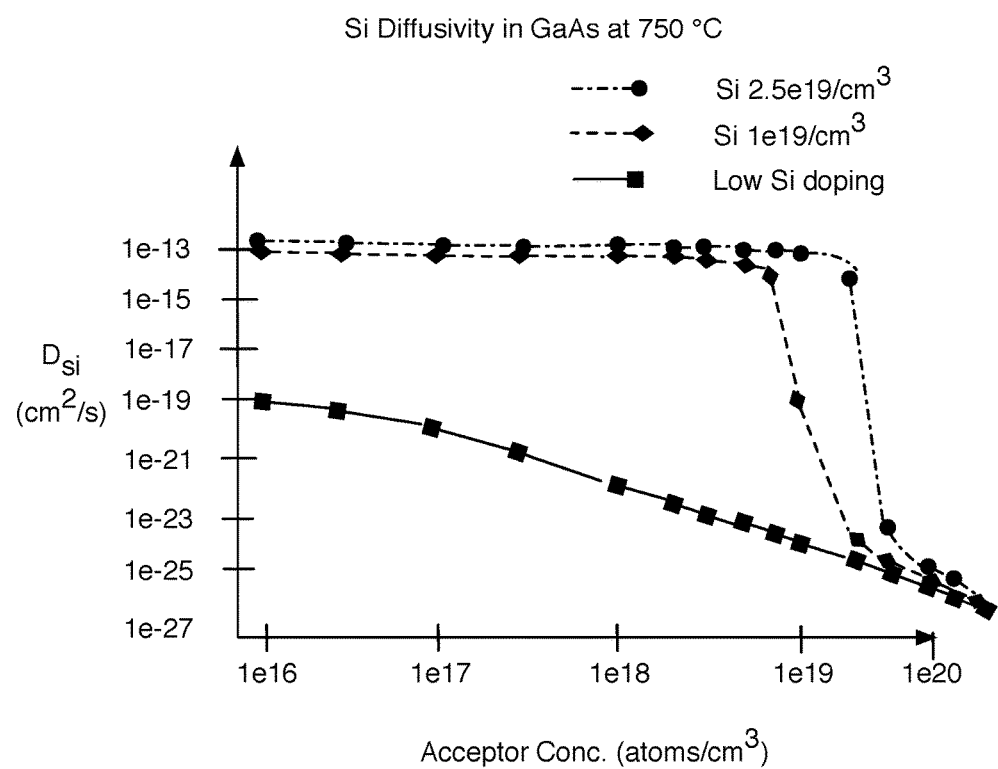
FIG. 1 is a graph illustrating the effect of counter-doping on silicon diffusivity in an exemplary III-V material, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are exemplary embodiments of heteroepitaxial structures including an elevated crystalline III-V structure extending over a crystalline silicon substrate. Using heteroepitaxial growth techniques to form the III-V structures, non-silicon devices (e.g., III-V channel field effect transistors), may be formed in raised structures extending over a first region of a silicon substrate. Silicon devices (e.g., silicon channel field effect transistors) may be formed in other regions of the silicon substrate.

Notably for III-V devices on silicon substrates, thermal transitions associated with various processes in semiconductor manufacturing tend to drive Si atoms from the underlying substrate into the non-silicon device region. Silicon atoms are an amphoteric dopant in most III-V materials, and often preferentially dope the III-V materials n-type. Under some circumstances such unintentional, solid-state diffusion-based doping of III-V material may be acceptable or even advantageous. For example, having an n-type doped III-V material between the active region and the substrate may be desirable in a PMOS transistor, for example improving electrical isolation of the active region. However, for a III-V NMOS transistor, an underlayer unintentionally doped n-type through silicon contamination could create an electrical path between the source/drain leading to very high off-state current $I_{off}$. With transistor critical dimensions continuing to scale down, even a slight unintentional n-type doping of III-V material adjacent to the active region (e.g., channel and/or source/drain regions) can degrade NMOS device performance dramatically.

Although counter-doping any III-V material between an active device region and silicon substrate with acceptor impurities promoting p-type conductivity might prevent the presence of silicon contamination from dictating the electrical conductivity type of the III-V material (i.e., relegating the silicon contamination to a background level), such an effort poses a substantial risk of thermally diffusing the various impurities into the channel region, eventually reducing the channel mobility. Such a counter-doping strategy may then only be successful for long channel devices.

Although not bound by theory, it is currently understood that silicon donor atoms may diffuse through III-V semiconductor material by way of negatively charged vacancies, the quantity of which can be reduced through counter-doping with acceptor impurities. In some embodiments therefore, only a base portion of the III-V material, far from the active area, is counter-doped. This counter-doped region functions as a diffusion barrier retarding diffusion of silicon from the substrate into substantially un-doped regions of the III-V material near the active region. Thermally diffused silicon atoms from the substrate become confined within the counter-doped III-V material functioning as a silicon diffusion barrier. Thus, rather than attempting to counter the electrical effects of silicon diffusion near an active region, counter-doping is employed to retard silicon diffusion at a point closer to the substrate, keeping the remainder of the III-V material there between more pure. The end result is an active region with high mobility and a device with lower off-state leakage current.

In some embodiments, a silicon diffusion barrier comprises a portion of III-V material with a counter-dopant impurity concentration sufficient to reduce silicon diffusivity $D_{si}$ by at least three orders of magnitude, advantageously five orders of magnitude, and more advantageously 10 orders of magnitude. FIG. 1 is a graph illustrating the effect of counter-doping on silicon diffusivity in an exemplary III-V material, in accordance with some embodiments. In FIG. 1, silicon diffusivity $D_{si}$ is modeled as a function of an acceptor impurity concentration (atoms/cm$^3$) in GaAs at 750° C. for three different concentration levels of silicon. The simulation illustrates how silicon diffusivity $D_{si}$ declines with higher acceptor concentration and the same is expected for other III—V alloys. While all three silicon doping levels react to the presence of acceptor impurities, the higher the silicon concentration, the higher the acceptor concentration required to significantly impede the diffusion of silicon within III-V material. For example, for silicon concentrations over 1e19 atoms/cm$^3$, acceptor concentrations over 1e19/cm$^3$ are needed. However, for a low silicon doping (e.g., below 1e18/cm$^3$), moderate levels of acceptor impurity concentrations (e.g., mid-e18/cm$^3$) reduce silicon diffusivity significantly ($D_{si}$ drops by 3-5 orders of magnitude).

Either the counter-doped III-V material thickness or location relative to the channel may be tuned to accommodate different levels of silicon diffusion associated with a given manufacturing process. In some embodiments, counter-doping impurity concentration is over 1e18 atoms/cm$^3$, and advantageously at least 5e18 atoms/cm$^3$. In some exemplary NMOS finFET embodiments, counter-doping is no more than 1e19 atoms/cm$^3$. These modest levels of counter-doping should avoid compromising short channel transistor performance even if the counter-dopant species thermally diffuses from the diffusion barrier and into an active (channel) region. Noting the concentration of thermally diffused silicon atoms declines as a function of distance from the III-V to silicon, the position of a counter-doped silicon diffusion barrier within the III-V material and/or thickness of the counter-doped III-V material, relative to the III-V/Si interface may be selected in conjunction with the counter-dopant impurity concentration to achieve the desired reduction in silicon diffusivity. Greater thicknesses of counter-doped III-V material and/or a given thickness of counter-doped III-V material located further from the III-V/silicon interface could be chosen where counter-doping concentration is lower. For the GaAs example above, an exemplary mid-e18/cm3 counter-doped III-V material may be advantageously positioned relative to the III-V/silicon substrate interface to occupy a region where the thermally diffused silicon concentration will remain less than 1e19/cm$^3$. The silicon diffusion barrier so located will yield the greatest reduction in silicon diffusivity. Process modeling software may be employed by one of ordinary skill to arrive at a suitable counter-dopant impurity concentration and position/thickness of III-V material so doped.

The embodiments described above are applicable for a wide area of devices and integrated circuitry implemented in a III-V material system disposed on a silicon substrate. Similar strategies may also be employed for other material systems heteroepitaxially grown on a silicon substrate (e.g., GaN-on-silicon, etc.). The principles and methodologies introduced above are further illustrated below in the context of exemplary field effect transistor (FET) embodiments utilizing semiconductor fin structures (e.g., finFETs). However, one of ordinary skill may readily apply these teachings equally well to other transistor designs (e.g., heterojunction bipolar transistors), other transistor geometries (e.g., planar transistors, or nanowire transistors). The principles and methodologies introduced above and expounded in finFET embodiments herein may also be applied to other microelectronic devices such as, but not limited, electro-optical devices (e.g., III-V photodetectors).

Figure 2:
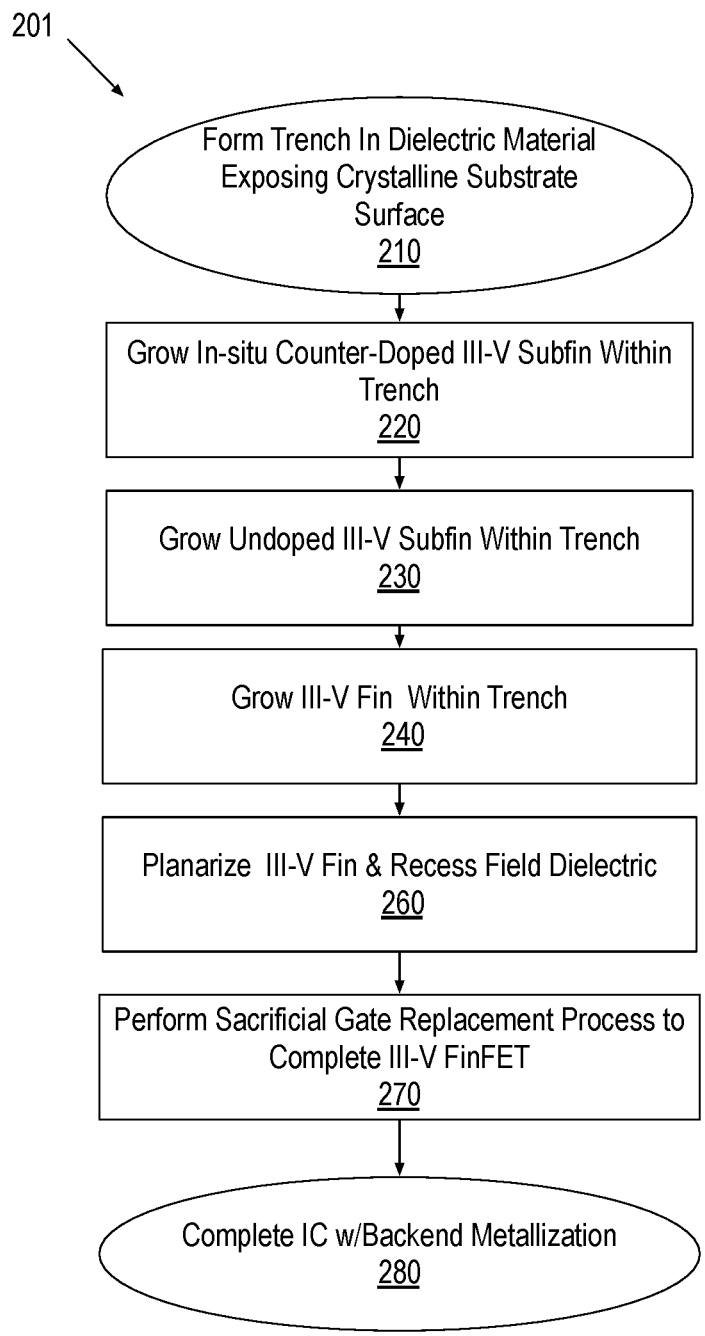
FIG. 2 is a flow diagram illustrating a method of forming a III-V transistor with a sub-fin silicon diffusion barrier, in accordance with some embodiments.

A variety of methods and/or techniques may be employed to fabricate FinFETs in III-V material to include a counter-doped silicon diffusion barrier in accordance with one or more embodiments. FIG. 2 is a flow diagram illustrating an exemplary method 201 for forming a III-V transistor with a sub-fin silicon dopant diffusion barrier, in accordance with some embodiments. FIGS. 3A, 3B, 3C, 3D, and 3E are isometric views illustrating a pair of fin structures evolving as operations in the method 201 are performed, in accordance with some embodiments.

In some exemplary embodiments, aspect ratio trapping (ART) is utilized to achieve acceptable crystal quality in heteroepitaxial III-V fin material. The ART technique described herein in the context of method 201 is an example of additive heteroepitaxial fin fabrication, which may advantageously reduce the effects of lattice mismatch across various heterojunctions within a given III-V material stack. In alternative embodiments, a conventional subtractive technique may be employed in which a blanket epitaxial film stack is grown over a silicon substrate and localized sub-fin counter-doping is introduced at an appropriate point in the growth of the blanket film stack. The blanket material would then be patterned into transistor structures (e.g., finFETs) using any known technique.

In reference to FIG. 2, at operation 210 a trench is formed in a dielectric material disposed over the silicon substrate. The trench may be patterned completely through a z-thickness of the dielectric material, exposing a crystalline silicon substrate surface that is to seed a subsequent epitaxial growth of III-V material. In the exemplary embodiment illustrated in FIG. 3A, operation 210 further entails forming fins on a crystalline silicon substrate. Any silicon fin patterning process may be employed to arrive at a plurality of silicon fins 306 extending from silicon substrate 305. Although not depicted, in some advantageous embodiments, silicon substrate 305 is further employed in the fabrication of any known silicon-channeled MOSFETs (e.g., as PMOS devices for monolithic integration of III-V MOS transistors to enable CMOS integrated circuitry). Crystallographic orientation of a substantially monocrystalline substrate 305 in exemplary embodiments is (100), (111), or (110). However, other crystallographic orientations are also possible. For example, the substrate working surface may be miscut, or offcut 2-10° toward [110], to facilitate nucleation of heteroepitaxial sub-fin material 110. Other substrate embodiments are also possible, with examples including silicon-carbide (SiC), a silicon on insulator (SOI) substrate, or silicon-germanium (SiGe).

Figure 3A:
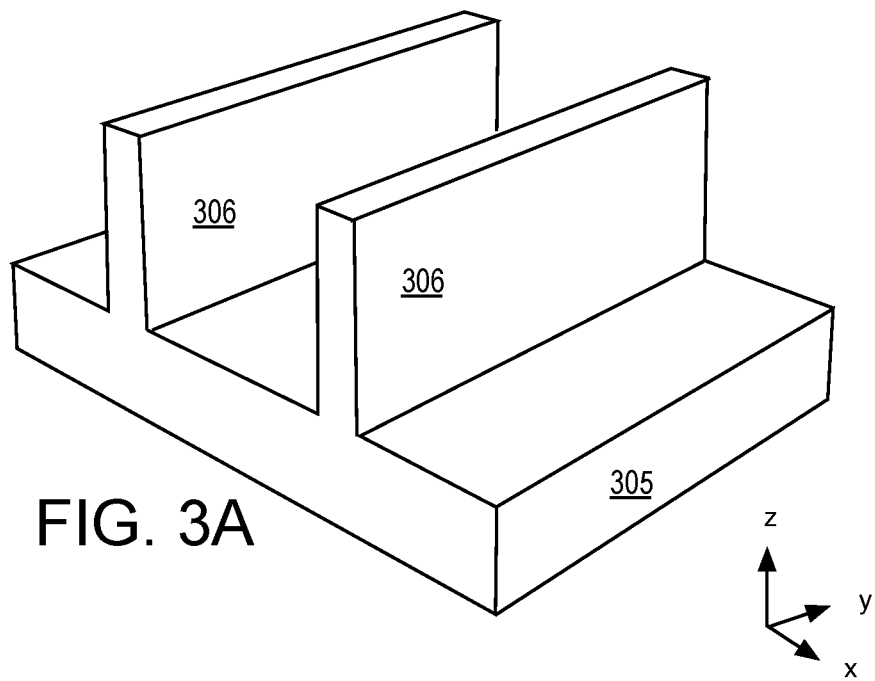
FIGS. 3A, 3B, 3C, 3D, and 3E are isometric views illustrating a pair of fin structures evolving as operations in the method depicted in FIG. 2 are performed, in accordance with some embodiments.
Figure 3B:
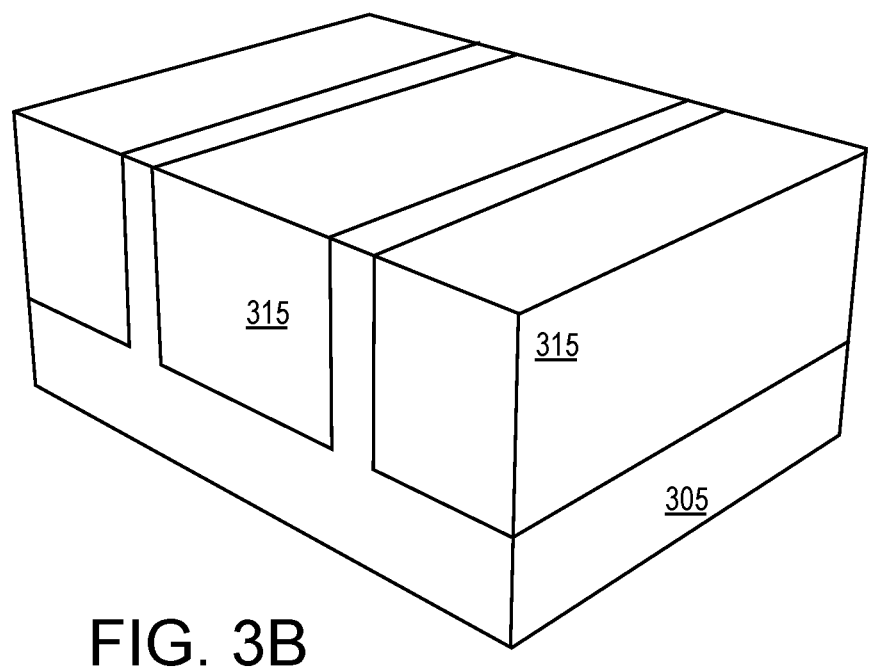
Figure 3C:
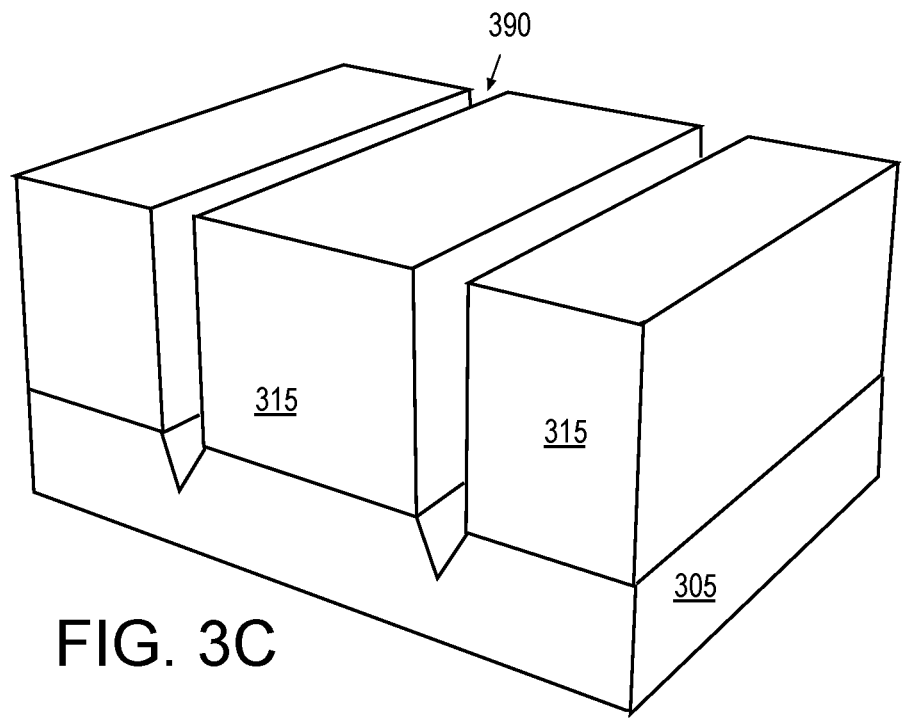

As further illustrated in FIG. 3B, a field dielectric material 315 is deposited over silicon fins 306, and planarized with a top surface of fins 306. Dielectric material 315 may be any dielectric material known suitable as a field isolation or shallow trench isolation (STI) material, such as, but not limited, to silicon dioxide. As further illustrated in FIG. 3C, silicon fins 306 are etched selectively relative to dielectric material 315, forming trench 390 exposing a portion of substrate 305. In some embodiments, the exposed portion of substrate 305 is recessed etched. In the illustrated example, a recess with positively sloped sidewalls is etched into substrate 305, which may further enhance trapping of crystalline defects (e.g., dislocations) in a subsequently grown crystalline sub-fin material. In some embodiments, where silicon substrate 305 is (100) silicon, a crystallographic wet etch is employed to remove silicon fins 306 and/or facet substrate 305 exposing (111) planes within the etched recess. The (111) planes may provide a better lattice match with III-V material, improving the quality of subsequently grown crystalline III-V material and reducing anti-phase boundary induced defects. But, other facet geometries could also be possible.

Although dimensions of trench 390 may vary, the aspect ratio (z-depth:y-dimension) is advantageously at least 2:1 and more advantageously 3:1, or more. In some embodiments, trench 390 has a smallest lateral critical dimension (CD) between 10 and 200 nm. However, trench material z-thickness and CD may be scaled as needed to maintain a workable aspect ratio for a predetermined fin height selected for a desired transistor current carrying width, etc.

Returning to FIG. 2, method 201 continues at operation 220 where a substantially monocrystalline III-V semiconductor sub-fin is (hetero)epitaxially grown from the silicon substrate surface (or from a seed layer heteroepitaxially grown thereon) exposed at the bottom of the trench formed at operation 210. The term "substantially" monocrystalline is employed to acknowledge that any number of crystalline defects may be present, but will tend to be trapped at the edges of the trench. In some embodiments, operation 220 entails epitaxially growing a first thickness of III-V semiconductor material such as, GaAs, GaAsSb, AlAsSb, InAs, InGaAs, InAlAs, InAlGaAs, AlGaAs, InP, GaP, AlAs, or InGaP. Any epitaxial growth technique, such as, but not limited to, metal-organic chemical vapor deposition (MOCVD), molecular beam epitaxy (MBE), or hydride vapor phase epitaxy (HVPE) may be utilized at operation 220. In exemplary embodiments, III-V material is epitaxially grown selectively on the substrate/seeding surface to partially back fill trench 390. At operation 220, feed gases and potentially other epitaxial process control parameters (e.g., temperature, partial pressures, etc.) are set to supply one or more non-amphoteric impurities. In exemplary embodiments, one or more source containing an acceptor impurity (e.g., C, Zn, Be, or Mg) is provided to in-situ dope the III-V epitaxial material p-type to a desired impurity concentration.

At operation 230, feed gases and potentially other epitaxial process control parameters (e.g., temperature, partial pressures, etc.) are changed to eliminate the supply of the non-amphoteric impurities and grow a second thickness of substantially undoped (i.e., not intentionally doped) III-V material from the surface of the counter-doped sub-fin region contained within the trench. Operations 220 and 230 may be performed in a continuous manner with an in-situ change in growth parameters. In some embodiments, operation 230 entails epitaxially growing a first thickness of III-V semiconductor material such as, GaAs, GaAsSb, AlAsSb, InAs, InGaAs, InAlAs, InAlGaAs, AlGaAs, InP, GaP, AlAs, or InGaP. In exemplary embodiments, the group III source and group V source supplies are not modulated between operations 220 and 230 such that the same III-V material is grown, a first thickness of which is counter-doped and a second thickness of which is not intentionally doped.

Method 201 continues at operation 240, where feed gases and potentially other epitaxial process control parameters (e.g., temperature, partial pressures, etc.) are changed to epitaxially grow active fin material from a surface of the undoped portion of the III-V sub-fin still contained within the trench. Operations 230 and 240 may be performed in a continuous manner with an in-situ change in growth parameters. In some embodiments, operation 240 entails heteroepitaxially growing a second of GaAs, GaAsSb, AlAsSb, InAs, InGaAs, InAlAs, InAlGaAs, AlGaAs, InP, GaP, AlAs, or InGaP. As such, the multiple III-V materials form a heterojunction fin structure, or hetero-fin. In some exemplary embodiments, the III-V material grown at operation 240 results in a conduction band offset. In some embodiments, III-V material grown at operation 240 has a narrower band gap than that of the III-V material grown at operation 230 (i.e., a type-I band offset). For example, where GaAs, AlAs, AlGaAs, or InP, is grown at operation 230, an InGaAs alloy (e.g., $In_{0.53}Ga_{0.47}As$) is grown at operation 240. In advantageous embodiments, operation 240 is performed without intentional doping, to grow III-V material with lowest possible impurity doping. Such a material has an advantageously high carrier (electron) mobility and low leakage current (with the charge carrier blocking CBO from the sub-fin III-V material). The fin III-V semiconductor material may be grown to a wide range of thicknesses as the material may be employed to provide a fin volume in which the active device region is to reside. Thicknesses of the fin III-V semiconductor material may be constrained to some predetermined target to arrive at a desired final hetero-fin height. In some exemplary embodiments, the third sub-fin III-V semiconductor material is grown to a thickness no more than 60 nm and advantageously 50 nm, or less.

Figure 3D:
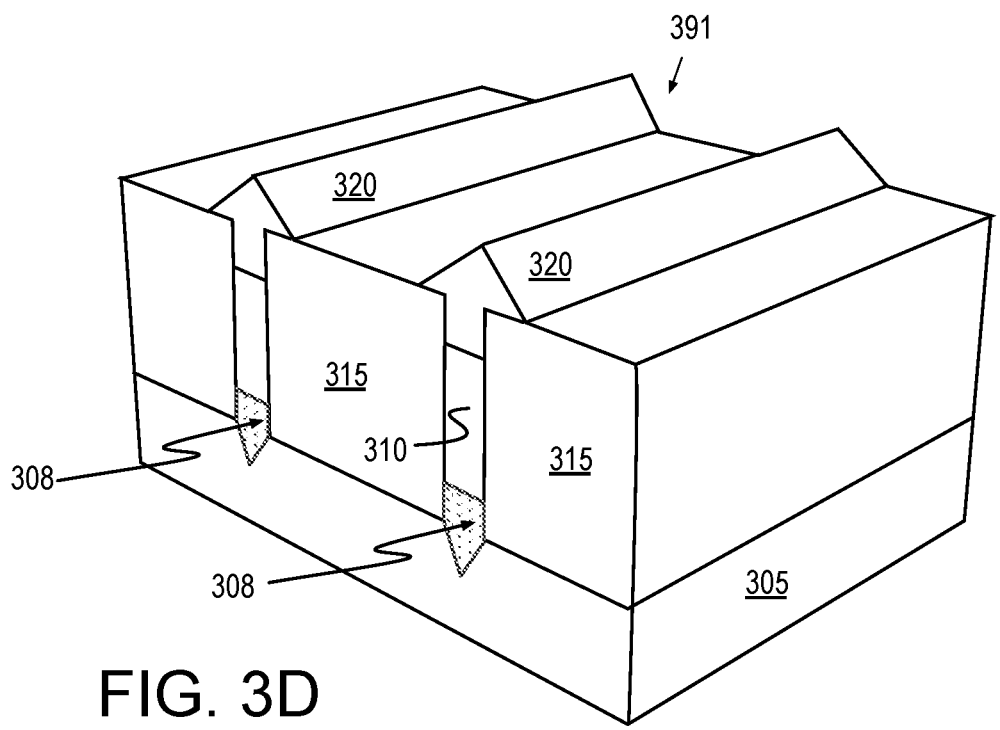

FIG. 3D further illustrates an exemplary structure following epitaxial fin growth operations 220-240. As shown, III-V hetero-fins 391 include a counter-doped III-V sub-fin base 308 proximal to, adjacent to, or near substrate 305. Hetero-fins 391 further include a substantially undoped III-V sub-fin portion 310 distal from silicon substrate 305, and proximal to, adjacent to, or near fin 320. Sub-fin base 308 is to function as the silicon diffusion barrier as described above, maintaining a lower level of silicon contamination within sub-fin portion 310 and fin 320.

Returning to FIG. 2, method 201 continues at operation 260 where the III-V fin material is planarized with the surrounding field dielectric material using any known technique(s). The field dielectric material is then recessed to a desired level to expose sidewalls of III-V fin material. In the exemplary embodiment illustrated in FIG. 3E, dielectric material 315 is recess etched to expose more or less of hetero-fins 391. In the illustrative embodiment, dielectric material 315 is recessed sufficiently to expose at least a majority of fin material 320, and more advantageously substantially all over fin material 320. In further embodiments, no sub-fin material 310 is exposed. In exemplary embodiments, III-V hetero-fins 391 have a maximum sidewall z-height $H_3$ of 20-80 nm. As further illustrated, the sub-fin, including a counter-doped sub-fin portion 308 and substantially undoped sub-fin portion 310, extends a maximum z-height $H_2$ from an interface with substrate 305. In some exemplary embodiments where a lateral CD of hetero-fin 391 is between 10-50 nm, sub-fin height $H_2$ is between 200 and 250 nm. In some further embodiments, counter-doped sub-fin portion 308 has a z-thickness $H_1$ that is no more than 25% of sub-fin height $H_2$. In exemplary embodiments where sub-fin height $H_2$ is between 200 and 250 nm, counter-doped sub-fin portion 308 has a maximum z-thickness $H_1$ of 20-50 nm.

Returning to FIG. 2, method 201 continues with fabricating a FET from each hetero-fin. Any known finFET process may be employed, including both gate-first and gate-last techniques. For an exemplary gate-last embodiment, a sacrificial gate formation and replacement process is performed at operation 270. In general, a gate stack mandrel is formed over a channel region of the exposed III-V fin. Any known sacrificial gate structure and fabrication techniques may be employed. For example, a sacrificial gate material may be formed over III-V fin material using any conventional technique. Sacrificial gate material can be formed on at least two sidewalls of fin material and land on adjacent field dielectric material. Gate spacer dielectric may also be formed using any conventional technique.

Source/drain regions are formed by depositing a heavily doped semiconductor of any suitable composition. In the some embodiments, an epitaxial process is employed to form monocrystalline source/drain regions. An interlayer dielectric (ILD) may be deposited over source/drain regions and planarized with the gate mandrel. The gate mandrel is then removed selectively relative to the surrounding dielectric material, exposing fin material. A gate stack is then formed over at least two sidewalls of the III-V fin material.

Method 201 is then completed with backend metallization including source/drain contact metals interconnecting the plurality of NMOS III-V finFETs into an IC, for example a CMOS IC further including PMOS transistors. In some embodiments, the PMOS transistors (e.g., finFETs) are silicon-channel devices and there is no equivalent concern associated with substrate silicon doping. In some alternative embodiments, the PMOS transistors (e.g., finFETs) each include a III-V semiconductor channel between p-type source/drain region and disposed over a sub-fin of III-V semiconductor material substantially free of the non-silicon impurities since substrate silicon doping of the sub-fin will tend to dope the sub-fin n-type, tending to improve electrical isolation.

Figure 3E:
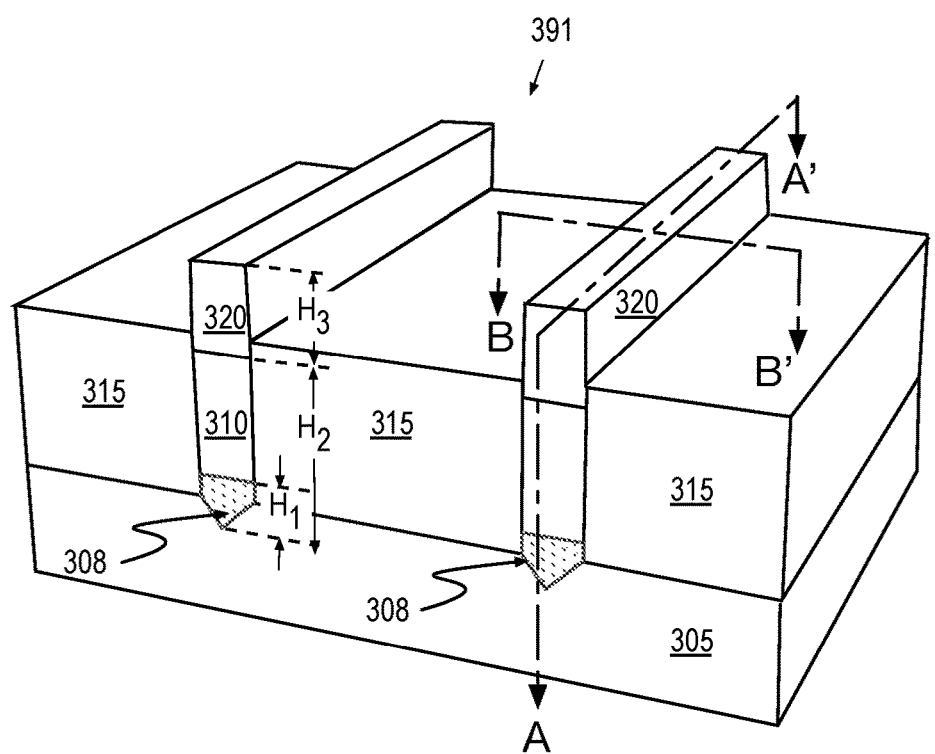
Figure 4A:
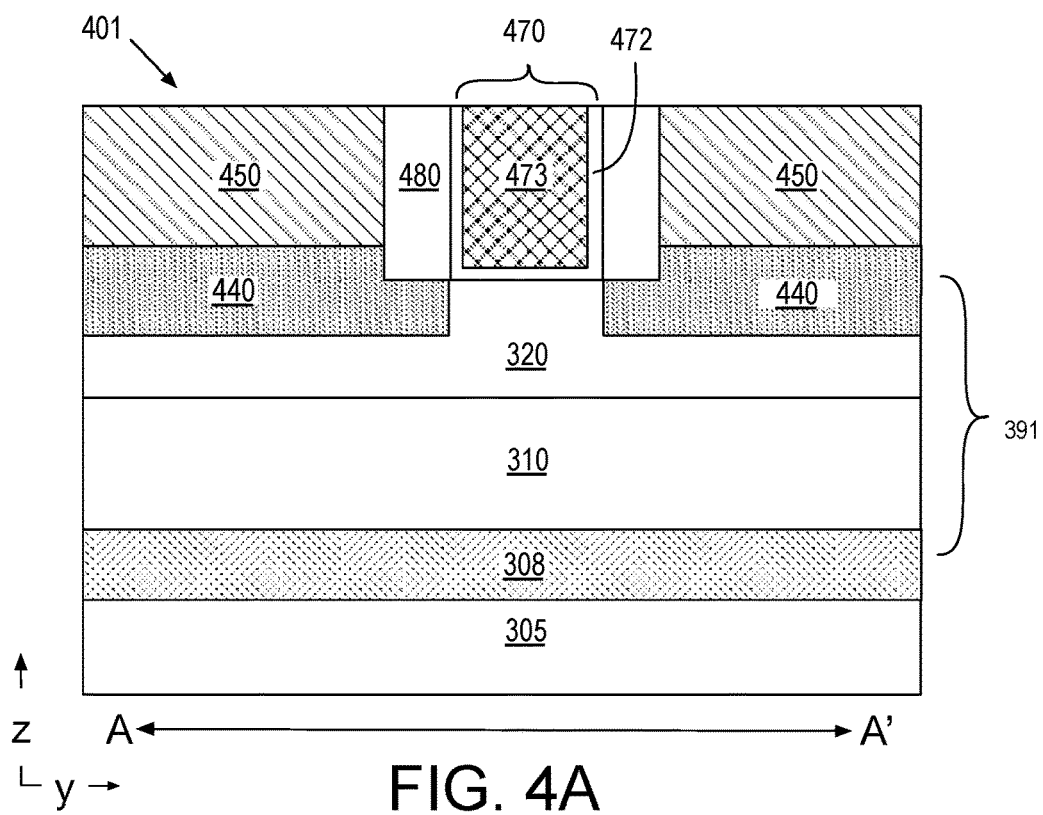
FIG. 4A illustrates a cross-sectional view through a length of a channel region and source/drain regions of a high mobility finFET employing the III-V structure illustrated in FIG. 3E, in accordance with some embodiments.
Figure 4B:
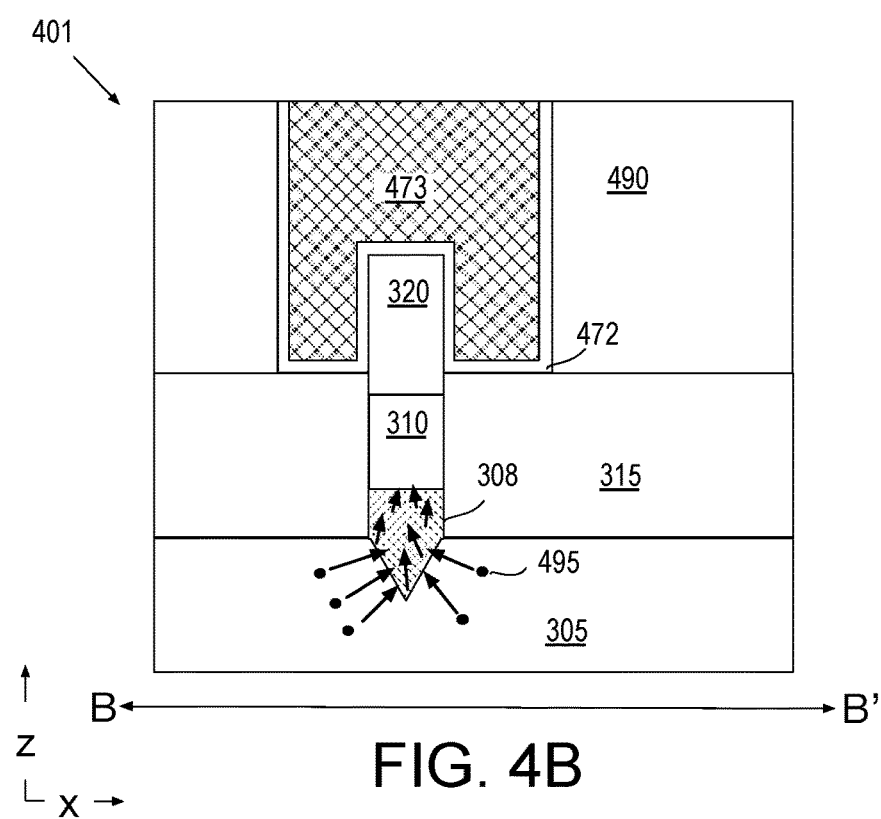
FIG. 4B illustrates a cross-sectional view through a width of a channel region and a gate electrode of the high mobility finFET depicted in FIG. 4A, in accordance with some embodiments.

FIG. 4A illustrates a cross-sectional view through a length of a channel region and source/drain regions of a III-V finFET 401 along the A-A' line depicted in FIG. 3E, in accordance with some embodiments. FIG. 4B illustrates a cross-sectional view through a width of a channel region and a gate electrode of III-V finFET 401 along the B-B' line depicted in FIG. 3E, in accordance with some embodiments. Transistor 401 includes a monocrystalline III-V hetero-fin 391 having a minimum lateral CD a first dimension (e.g., x) and a longer lateral CD in a second dimension (e.g. y). An active device region including a channel region is disposed within fin material 320.

Transistor 401 includes a channel region covered by a gate stack 470 including a gate dielectric 472 and gate electrode 473. The channel region is to be modulated through the field effect applied by an overlying gate electrode 473. While any known gate stack materials may be utilized, in one exemplary embodiment gate dielectric 472 is a high-k material with a bulk relative dielectric constant of 9, or more (e.g., $Al_2O_3$, $HfO_2$, etc.). Gate electrode 473 may include any metal with a work function suitable for the III—V alloy of fin material 320. The channel region is further disposed between a pair of heavily doped III-V semiconductor source/drains 440. III-V semiconductor source/drains may be of a different alloy than that of the channel and doped, for example, to at least 1e19 donor impurity atoms/cm$^3$. Doped source/drain material 440 may be any material suitable for ohmic contact to fin material 320, such as, but not limited to, InAs. In some embodiments, source/drain material 440 is single crystalline. Metal source/drain contacts 450 are in contact with doped source/drain material 440 and are electrically isolated from gate stack 470 by interlayer dielectric 480 and/or lateral spacers of gate dielectric 472.

Transistor 401 includes a sub-fin of one or more III-V semiconductor materials disposed between the fin 320 and silicon substrate 305. Following the various thermal processes associated with fabricating transistor 401 (including backend interconnect metallization), sub-fin base portion 308 adjacent to, or near, substrate 305 comprises a higher concentration of non-silicon impurities than does sub-fin portion 310. The non-silicon impurities include non-amphoteric impurities, and in exemplary embodiments include one or more acceptor impurity species, such as one or more of C, Zn, Be, or Mg. With sub-fin base portion 308 comprising a silicon diffusion barrier, the concentration of silicon impurities in sub-fin base portion 308 is also higher than in sub-fin portion 310 (and fin 320). As further illustrated in FIG. 4B, silicon atoms 495 thermally diffuse from substrate 305 and enter III-V material of sub-fin base portion 308. Diffusivity of the silicon atoms decreases within sub-fin base portion 308 as a function of declining silicon concentration and increasing non-silicon impurity concentration within sub-fin base portion 308.

In some embodiments, after IC manufacture, the concentration of the non-silicon (acceptor) impurities with sub-fin base portion 308 is over 1e18 atoms/cm$^3$, advantageously in the mid-e18 atoms/cm$^3$ (e.g., 3e18-7e18 atoms/cm$^3$), more advantageously at least 5e18 atoms/cm$^3$. In further embodiments, a concentration of non-silicon impurities within sub-fin portion 310 is below 1e18 atoms/cm$^3$, and advantageously below 1e17 atoms/cm$^3$ at least at the interface of fin 320 (while acceptor concentration may be 5-8e17 atoms/cm$^3$ within a region sub-fin portion 310 adjacent to sub-fin base portion 308). In further embodiments, sub-fin base portion 308 has a concentration of silicon impurities at an interface with substrate 305 (e.g., at least 1e19 atoms/cm3) that is at least an order of magnitude higher than the concentration of silicon impurities within sub-fin portion 310 at an interface of fin material 320 (e.g., no more than 1e18 atoms/cm$^3$). For these exemplary embodiments, concentration of silicon or non-silicon impurities within fin material 320 is below 1 e18 atoms/cm$^3$. Depending on the technique, the concentration of silicon and/or non-silicon impurities within fin 320 may be undetectable (i.e., below detection limit of the technique). For example, Atomic Probe Tomography (APT) may be unable to detect silicon in fin 320, while Secondary Ion Mass Spectrometry (SIMS) may be able to detect silicon at some e17 atoms/cm$^3$ concentration, or lower.

As noted above, the presence of a dopant diffusion barrier layer in the sub-fin epitaxial stack is beneficial for many device structures beyond the finFET architecture described in the context of exemplary embodiments. For example, although the sub-fin may be at least partially sacrificial in a gate-all-around (nanowire) transistor, it is still important to control thermal diffusion of silicon into the nanowire channel during processing upstream of releasing the fin from the substrate. Therefore, a counter-doped diffusion barrier may be incorporated into a sub-fin substantially as described, but then be at least partially removed during subsequent processing.

Figure 5:
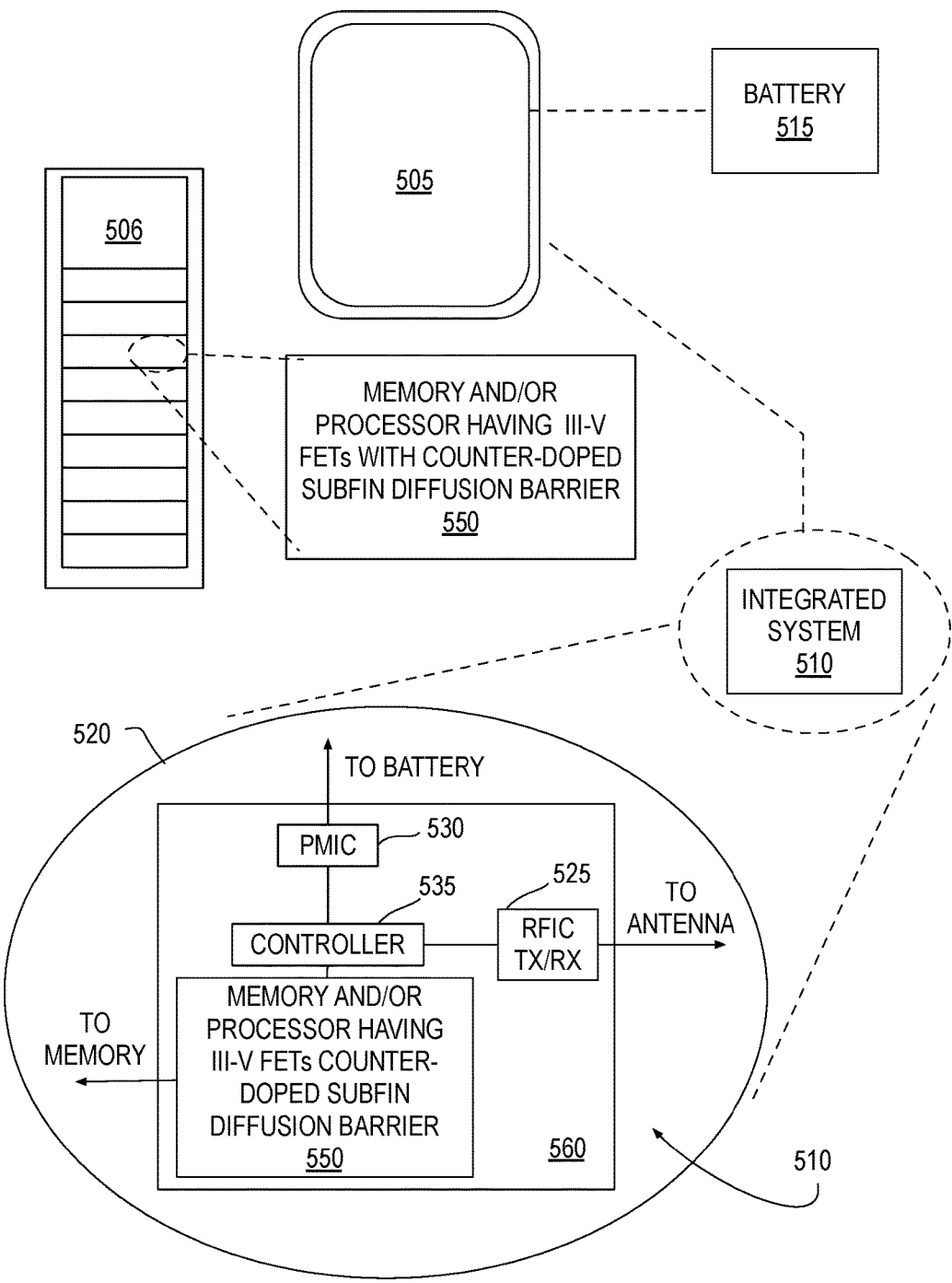
FIG. 5 illustrates a mobile computing platform and a data server machine employing an SoC including a transistor with localized sub-fin isolation, in accordance with embodiments of the present invention.

FIG. 5 illustrates a mobile computing platform and a data server machine employing an SoC including a III-V transistor with a counter-doped diffusion barrier, in accordance with embodiments of the present invention. The server machine 506 may be any commercial server, for example including any number of high-performance computing platforms disposed within a rack and networked together for electronic data processing, which in the exemplary embodiment includes a packaged monolithic SoC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone packaged chip within the server machine 506, packaged monolithic SoC 550 includes a memory block (e.g., RAM), a processor block (e.g., a microprocessor, a multi-core microprocessor, graphics processor, or the like) including at least one III-V channeled finFET with a counter-doped sub-fin diffusion barrier, for example as describe elsewhere herein. The monolithic SoC 550 may be further coupled to a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535.

Functionally, PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs or integrated into monolithic SoC 550.

Figure 6:
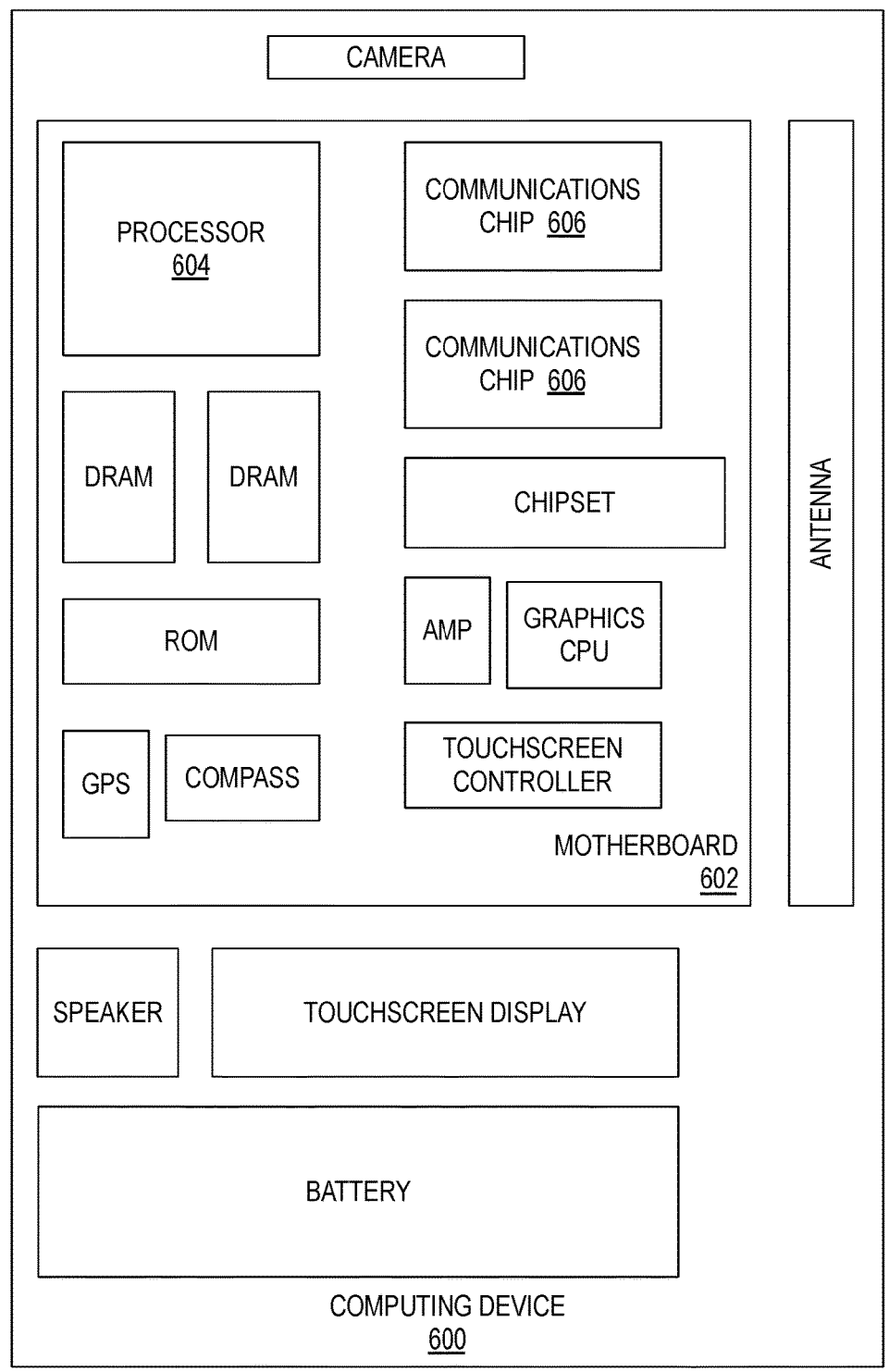
FIG. 6 is a functional block diagram of an electronic computing device, in accordance with an embodiment of the present invention.

FIG. 6 is a functional block diagram of an electronic computing device, in accordance with an embodiment of the present invention. Computing device 600 may be found inside platform 505 or server machine 506, for example. Device 600 further includes a motherboard 602 hosting a number of components, such as, but not limited to, a processor 604 (e.g., an applications processor), which may further incorporate at least one III-V semiconductor channeled finFET including a counter-doped sub-fin diffusion barrier, in accordance with embodiments of the present invention. Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments a transistor comprises an active region disposed within a fin of a first III-V semiconductor material, and a sub-fin comprising one or more second III-V semiconductor materials, having a different III—V alloy composition than the first III-V semiconductor material, disposed between the fin and a silicon substrate, wherein a first portion of the sub-fin disposed between the substrate and a second portion of the sub-fin comprises a higher concentration of non-silicon impurities than the second portion.

In furtherance of the first embodiments, the first portion of the sub-fin comprises a concentration of silicon impurities that is at least an order of magnitude higher than that of the second portion.

In furtherance of the first embodiments, the active region comprises a channel region of III-V semiconductor material disposed between a pair of doped semiconductor source/drain regions. The transistor further comprises a gate electrode disposed over the channel region, and a pair of source/drain contacts coupled to the pair of source/drain regions.

In furtherance of the first embodiments immediately above, the pair of source/drains are n-type conductivity, the non-silicon impurities comprise acceptor impurities.

In furtherance of the first embodiments immediately above, the acceptor impurities comprises at least one of: C, Zn, Be, or Mg.

In furtherance of the first embodiments, a concentration of the non-silicon impurities is over 1e18 atoms/cm$^3$ within the first portion of the sub-fin. A concentration of the non-silicon impurities is below 1e18 atoms/cm$^3$ within the second portion of the sub-fin.

In furtherance of the first embodiments immediately above, the concentration of silicon or non-silicon impurities within the fin is below 1e18 atoms/cm$^3$.

In furtherance of the first embodiments immediately above, the concentration of the non-silicon impurities is at least 5e18 atoms/cm$^3$ within the first portion of the sub-fin.

In furtherance of the first embodiments, the sub-fin extends to a height from an interface with the substrate, and the first portion of the sub-fin extends from the interface to no more than 25% of the sub-fin height.

In furtherance of the first embodiments immediately above, the sub-fin extends to a height from the interface with the substrate of 200-250 nm. The first portion of the sub-fin extends from the interface a maximum of 20-50 nm.

In furtherance of the first embodiments immediately above, the fin structure further comprises a first III-V semiconductor material, and the base portion and second portion of the sub-fin structure further comprise a second III-V semiconductor material, In furtherance of the first embodiments immediately above, the first III-V semiconductor comprises a first of GaAs, GaAsSb, AlAsSb, InAs, InGaAs, InAlAs, InAlGaAs, AlGaAs, InP, GaP, AlAs, or InGaP, and at least one of the first portion and second portion of the sub-fin comprises a second of GaAs, GaAsSb, AlAsSb, InAs, InGaAs, InAlAs, InAlGaAs, AlGaAs, InP, GaP, AlAs, or InGaP.

In one or more second embodiments, a device including integrated circuitry comprises a plurality of n-type finFETs, each including a channel region of a III-V semiconductor fin disposed between a pair of doped semiconductor source/drain regions, a sub-fin comprising one or more III-V semiconductor materials disposed between the fin and a silicon substrate. A first portion of the sub-fin disposed between the substrate and a second portion of the sub-fin comprises a higher concentration of non-silicon impurities than does the second portion. The fitFETs further include a gate electrode disposed over the channel region, and a pair of source/drain contacts coupled to the pair of source/drain regions. The device further includes a plurality of p-type finFETs electrically coupled to the plurality of n-type finFETs.

In furtherance of the second embodiments, the plurality of p-type finFETs each include active regions comprising a group IV semiconductor material.

In furtherance of the second embodiments, the plurality of p-type finFETs each include active regions comprising a third III-V semiconductor material disposed over a sub-fin of III-V semiconductor material substantially free of the non-silicon impurities.

In one or more third embodiment, a method of forming a transistor comprises epitaxially growing a first thickness of a first III-V semiconductor material over a seeding surface of the substrate while supplying a non-silicon impurity to in-situ dope the first thickness, epitaxially growing a second thickness of the first III-V semiconductor material over the first thickness without supplying the non-silicon impurity, epitaxially growing a second III-V semiconductor material over the first III-V semiconductor material, and forming an active region of the transistor in the second III-V semiconductor material.

In furtherance of the third embodiments, the method further comprises forming a trench in a field dielectric material, the trench exposing a crystalline surface of the substrate. Epitaxially growing the first thickness of material further comprises growing the first III-V semiconductor material within the trench and in-situ doping the first thickness of material to a concentration of at least 5e18 acceptor impurity atoms/cm$^3$. Epitaxially growing the second thickness of material further comprises growing the first III-V semiconductor material within the trench and in-situ doping the second thickness of material to a concentration of no more than 1e18 acceptor impurity atoms/cm$^3$.

In furtherance of the third embodiments immediately above, epitaxially growing the first thickness of material further comprises in-situ doping the first thickness of material with a source containing at least one of C, Zn, Be, or Mg.

In furtherance of the third embodiments, epitaxially growing the first and second thicknesses of material further comprises growing the first thickness to no more than 25% of a sum of the first and second thicknesses.

In furtherance of the third embodiments, epitaxially growing at least one of the first and second thicknesses of material further comprises growing a first of GaAs, GaAsSb, AlAsSb, InAs, InGaAs, InAlAs, InAlGaAs, AlGaAs, InP, GaP, AlAs, or InGaP, and epitaxially growing the second III-V material further comprises growing a second of GaAs, GaAsSb, AlAsSb, InAs, InGaAs, InAlAs, InAlGaAs, AlGaAs, InP, GaP, AlAs, or InGaP.

In furtherance of the third embodiments, the transistor is a fin field effect transistor (finFET), and forming the transistor further comprises planarizing the field dielectric material with a surface of III-V semiconductor material, recessing the field dielectric material to expose sidewalls of the III-V semiconductor material having no more than 1e18 non-silicon impurity atoms/cm$^3$, forming a gate stack over a channel region of the III-V semiconductor material, and forming a pair of source/drain regions electrically coupled to opposite ends of the channel region.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor, comprising:
   an active region within a fin of a first III-V semiconductor material; and
   a sub-fin comprising one or more second III-V semiconductor materials, having a different III-V alloy composition than the first III-V semiconductor material, the sub-fin between the fin and a substrate comprising silicon, wherein a first portion of the sub-fin between the substrate and a second portion of the sub-fin comprises a higher concentration of non-silicon impurities than the second portion.

2. The transistor of claim 1, wherein the first portion of the sub-fin comprises a concentration of silicon impurities that is at least an order of magnitude higher than that of the second portion.

3. The transistor of claim 1, wherein the active region comprises III-V semiconductor material that is between a pair of doped semiconductor source/drain regions; and
   further comprising:
   a gate electrode disposed over the active region; and
   a pair of source/drain contacts coupled to the pair of source/drain regions.

4. The transistor of claim 3, wherein:
   the pair of source/drains are n-type conductivity; and
   the non-silicon impurities comprise acceptor impurities.

5. The transistor of claim 4, wherein the acceptor impurities comprise at least one of C, Zn, Be, or Mg.

6. The transistor of claim 1, wherein
   a concentration of the non-silicon impurities within the first portion of the sub-fin is over 1e18 atoms/cm$^3$; and
   a concentration of the non-silicon impurities within the second portion of the sub-fin is below 1e18 atoms/cm$^3$.

7. The transistor of claim 1, wherein:
   the concentration of silicon or non-silicon impurities within the fin is below 1e18 atoms/cm$^3$.

8. The transistor of claim 7, wherein:
   the concentration of the non-silicon impurities within the first portion of the sub-fin is at least 5e18 atoms/cm$^3$.

9. The transistor of claim 1, wherein:
   the sub-fin extends to a height from an interface with the substrate; and
   the first portion of the sub-fin extends from the interface to no more than 25% of the sub-fin height.

10. The transistor of claim 9, wherein:
    the sub-fin extends to a height from the interface with the substrate of 200-250 nm; and
    the first portion of the sub-fin extends from the interface a maximum of 20-50 nm.

11. The transistor of claim 1, wherein:
    the fin structure further comprises a first III-V semiconductor material; and
    the base portion and second portion of the sub-fin structure further comprise a second III-V semiconductor material.

12. The transistor of claim 11, wherein:
    the first III-V semiconductor comprises a first of GaAs, GaAsSb, AlAsSb, InAs, InGaAs, InAlAs, InAlGaAs, AlGaAs, InP, GaP, AlAs, or InGaP; and
    at least one of the first portion and second portion of the sub-fin comprises a second of GaAs, GaAsSb, AlAsSb, InAs, InGaAs, InAlAs, InAlGaAs, AlGaAs, InP, GaP, AlAs, or InGaP.

13. A device including integrated circuitry, comprising:
    a plurality of n-type finFETs, each including:
    an active region of a III-V semiconductor fin between a pair of doped semiconductor source/drain regions;

a sub-fin comprising one or more III-V semiconductor materials between the fin and a substrate comprising silicon, wherein a first portion of the sub-fin between the substrate and a second portion of the sub-fin comprises a higher concentration of non-silicon impurities than the second portion;
a gate electrode over the active region; and
a pair of source/drain contacts coupled to the pair of source/drain regions; and
a plurality of p-type finFETs electrically coupled to the plurality of n-type finFETs.

14. The device of claim 13, wherein the plurality of p-type finFETs each include active regions comprising a group IV semiconductor material.

15. The device of claim 13, wherein the plurality of p-type finFETs each include active regions comprising a third III-V semiconductor material disposed over a sub-fin of III-V semiconductor material substantially free of the non-silicon impurities.

* * * * *